(12) United States Patent
Khursheed et al.

(10) Patent No.: US 6,320,194 B1
(45) Date of Patent: *Nov. 20, 2001

(54) PORTABLE HIGH RESOLUTION SCANNING ELECTRON MICROSCOPE COLUMN USING PERMANENT MAGNET ELECTRON LENSES

(75) Inventors: Anjam Khursheed; Jacob Chee Hong Phang; John Thiam Leong Thong, all of Singapore (SG)

(73) Assignee: Institute of Materials Research and Engineering, Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 09/563,117

(22) Filed: May 2, 2000

Related U.S. Application Data

(63) Continuation of application No. 09/016,593, filed on Jan. 30, 1998, now Pat. No. 6,057,553.

(30) Foreign Application Priority Data

Sep. 27, 1997 (SG) .................................................. 9703597

(51) Int. Cl.[7] .................................................. H01J 37/18

(52) U.S. Cl. ......................................................... 250/442.11
(58) Field of Search ........................... 250/442.11, 441.11, 250/440.11, 310, 311, 396 R, 396 ML

(56) References Cited

U.S. PATENT DOCUMENTS

| 4,962,308 | * | 10/1990 | Bormans et al. | 250/396 R |
|---|---|---|---|---|
| 5,029,249 | * | 7/1991 | Ohtaka | 250/310 |
| 5,324,950 | * | 6/1994 | Otaka et al. | 250/441.11 |
| 5,442,183 | * | 8/1995 | Matsui et al. | 250/441.11 |
| 6,057,553 | * | 5/2000 | Khursheed et al. | 250/442.11 |

\* cited by examiner

Primary Examiner—Kiet T. Nguyen
(74) Attorney, Agent, or Firm—Pillsbury Winthrop LLP; David H. Jaffer

(57) ABSTRACT

A detachable, portable SEM column that is easily disconnected from the electron gun assembly and specimen chamber of the system, allowing different column designs to be used in a given SEM system. As an alternate design, the electron gun and column are configured as a single detachable, portable assembly. The column of the present invention contains a condenser lens and an objective lens, both designed employing permanent magnet elements for primary field generation. Relatively small coils are used for scanning and precise adjustment of focus.

8 Claims, 3 Drawing Sheets

PORTABLE HIGH RESOLUTION SCANNING ELECTRON MICROSCOPE COLUMN USING PERMANENT MAGNET ELECTRON LENSES

This Application is a Continuation of Ser. No. 09/016,593 filed Jan. 30, 1998 now U.S. Pat. No. 6,057,553.

BACKGROUND OF THE INVENTION

1. Field of the Invention

The present invention relates generally to scanning electron microscopes, and more particularly to a portable high resolution scanning electron microscope column using permanent magnet electron lenses.

2. Brief Description of the Prior Art

Prior art scanning electron microscopes are large and complicated structures, each system designed for a particular set of parameters. A scanning electron microscope has an electron gun for injecting high speed beams of electrons into one end of a column. Magnetic lenses in the column focus and sweep the beam, aimed at a specimen positioned in a chamber at the opposite end of the column. The electron gun, column and specimen chamber of the prior art are an integral assembly connected to a system of vacuum pumps and drive electronics. A major disadvantage of these prior art systems is their lack of flexibility. For example, if a specimen does not fit a particular SEM chamber, a different SEM with an appropriate specimen chamber must be found. In addition to the inflexibility of the specimen chamber, prior art SEM columns are also designed for particular applications. One design might be optimized for high resolution at low primary beam voltages, while another might be optimized for high primary voltages. Currently, different requirements of this kind demand the use of different scanning electron microscopes. A primary contributor to the lack of flexibility in SEM systems is the size and complexity of the SEM column. Columns contain magnetic electron lenses, with magnetic fields supplied by large high current density electro-magnets. These large magnets contribute to the column internal volume, which along with the specimen chamber, must be evacuated to allow the passage of the high speed electrons. The large internal volume of these structures naturally requires a large, complicated vacuum system. Any attempt to reduce the size of the electromagnets results in high current losses in the magnet coils, which then require bulky, complicated cooling systems.

Electromagnets in early systems were a problem due to inadequately regulated power supplies which caused current variations and corresponding magnetic field variations. As a result of this, early attempts were made to design permanent magnet systems which were found to provide stable magnetic fields. These attempts were abandoned for most applications, however, due to their inability to provide adequate field strength. Subsequent designs utilizing better current regulating circuitry were exclusively electro-magnetic. A glance through a typical textbook on scanning electron microscopes will reveal the bulky, complicated, inflexible nature of these prior art systems, which could easily fill a large room.

In view of the current state of scanning electron microscope systems as explained above, there is clearly a need for a smaller sized, less complicated, and more flexible scanning electron microscope system and system components.

SUMMARY OF THE INVENTION

It is therefore an object of the present invention to provide a SEM system allowing a choice of probe resolution for specific applications through provision of an easily replaceable SEM column.

It is a further object of the present invention to provide a reduced size, lighter weight SEM column.

It is a still further object of the present invention to provide a reduced size, lighter weight SEM column that can be easily replaced in an SEM system.

It is a still further object of the present invention to provide a portable SEM column and electron gun assembly which is easily removable from a SEM system.

Briefly, a preferred embodiment of the present invention includes a detachable, portable SEM column that is easily disconnected from the electron gun assembly and specimen chamber of the system, allowing different column designs to be used in a given SEM system. As an alternate design, the electron gun and column are configured as a single detachable, portable assembly. The column of the present invention contains a condenser lens and an objective lens, both designed employing permanent magnet elements for primary field generation. Relatively small coils are used for scanning and precise adjustment of focus.

IN THE DRAWING

DESCRIPTION OF THE PREFERRED EMBODIMENT

Figure 1:
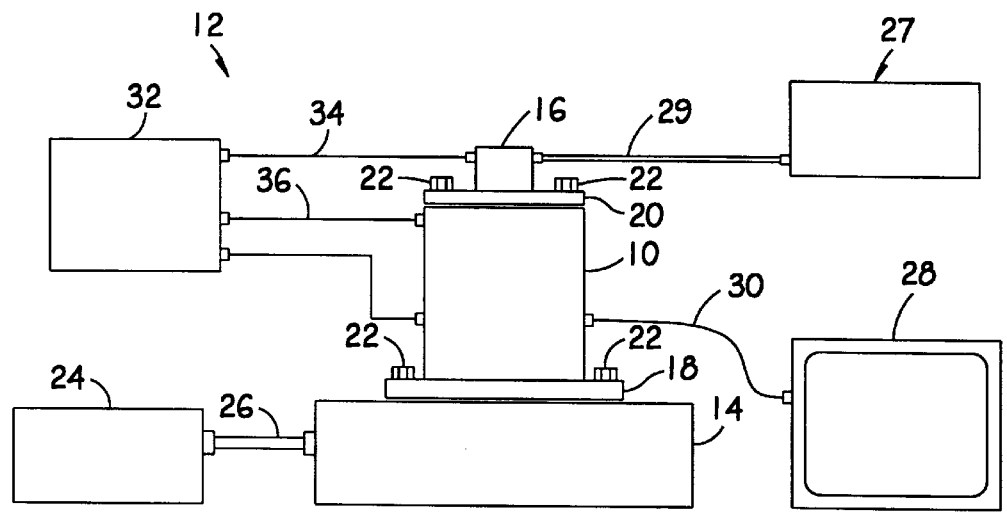
FIG. 1 shows a SEM system with a removable SEM column.

Referring now to FIG. 1 of the drawing, the concept of the present invention is illustrated, showing a detachable, portable SEM column 10 installed in an SEM system 12, the various components of which are shown in block diagram form. The column 10 is attached to a specimen chamber 14 and an electron gun 16. Flanges 18, 20 and bolts 22 are shown as a method of attachment of the specimen chamber and electron gun, but other methods known to those skilled in the art are also included in the spirit of the present invention. The SEM system 12 also includes a vacuum pump 24, connected to the specimen chamber 14 by vacuum line 26 for evacuating the specimen chamber 14 and column 10, and a vacuum pump 27 and line 29 for evacuating the electron gun 16. A display 28 is connected to the column 10 via cable 30 for view of the detected image. Voltage supply to the electron gun 16, scanning and focusing current, and bias voltage are all provided by a power supply or supplies indicated as console 32, with supply lines 34, 36, 38.

In operation, any one of a number of columns 10, each designed for a different application can be used with the SEM system 12. This represents considerable savings in cost and space over prior art systems, each of which was designed for a particular narrow range of operation. In application, the system 12 will allow, for example, a facility of small means to significantly expand their range of research.

An alternate design includes an integrated column 10 and electron gun 16 assembly which is replaced as a unit. In some cases, this is beneficial, allowing the use of optimized gun-columned combinations.

A further application and benefit of the system 12 is that it allows substitution of the specimen chamber in order to accommodate different size specimens, and substitution of the electron gun. The relatively small, light weight and uncomplicated detachable column makes this flexibility possible. Prior art columns are much more bulky and complicated due to their reliance on electromagnets, which add further bulk and complication to the system due to water cooling requirements.

Figure 2:
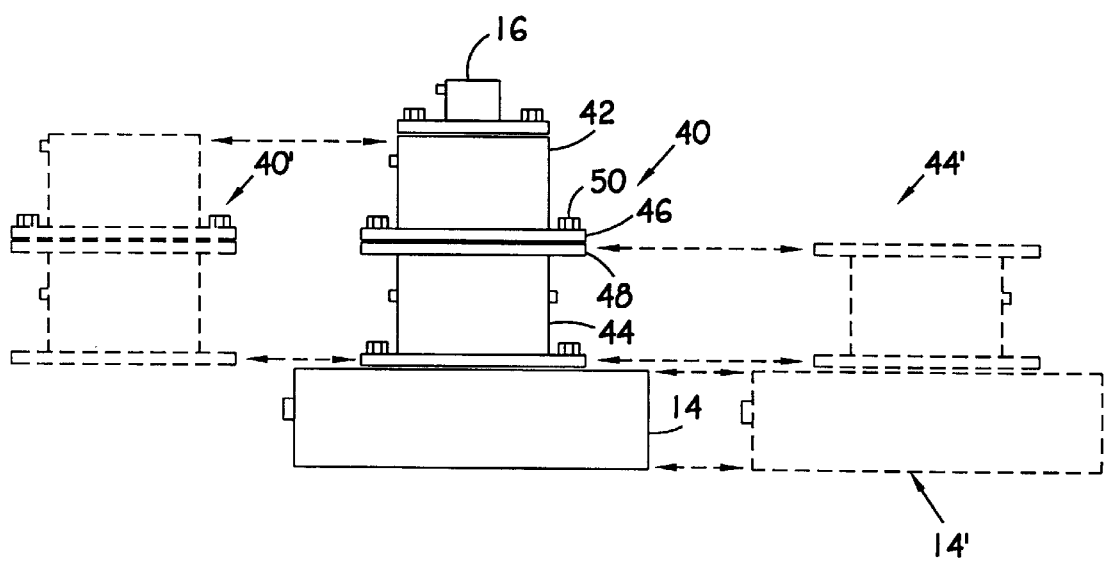
FIG. 2 shows a two part removable SEM column.

Referring now to FIG. 2 of the drawing, the flexibility of the present invention is illustrated more clearly by showing only the electron gun 16, specimen chamber 14 and a column 40. The column 40 of FIG. 2 differs from the column 10 of FIG. 1 in that it is shown having a top portion 42 removably attached to a bottom portion 44. The method of attachment shown is with flanges 46, 48 and bolts 50, but other methods of attachment are also included in the spirit of the invention. It is also well understood by those skilled in the art how to vacuum seal the various fittings and part interconnections, for example by use of O-rings, etc. which are not shown. According to the present invention, any of the SEM parts 14, 16, 40, 42, 44 or combinations of them can be replaced as required for a particular measurement. Dashed outline 44' symbolically represents replacing the lower portion 44 of the column. Dashed outlines 14' and 40' similarly symbolize the replacement of the chamber 14 and/or column 40, respectively.

Figure 3:
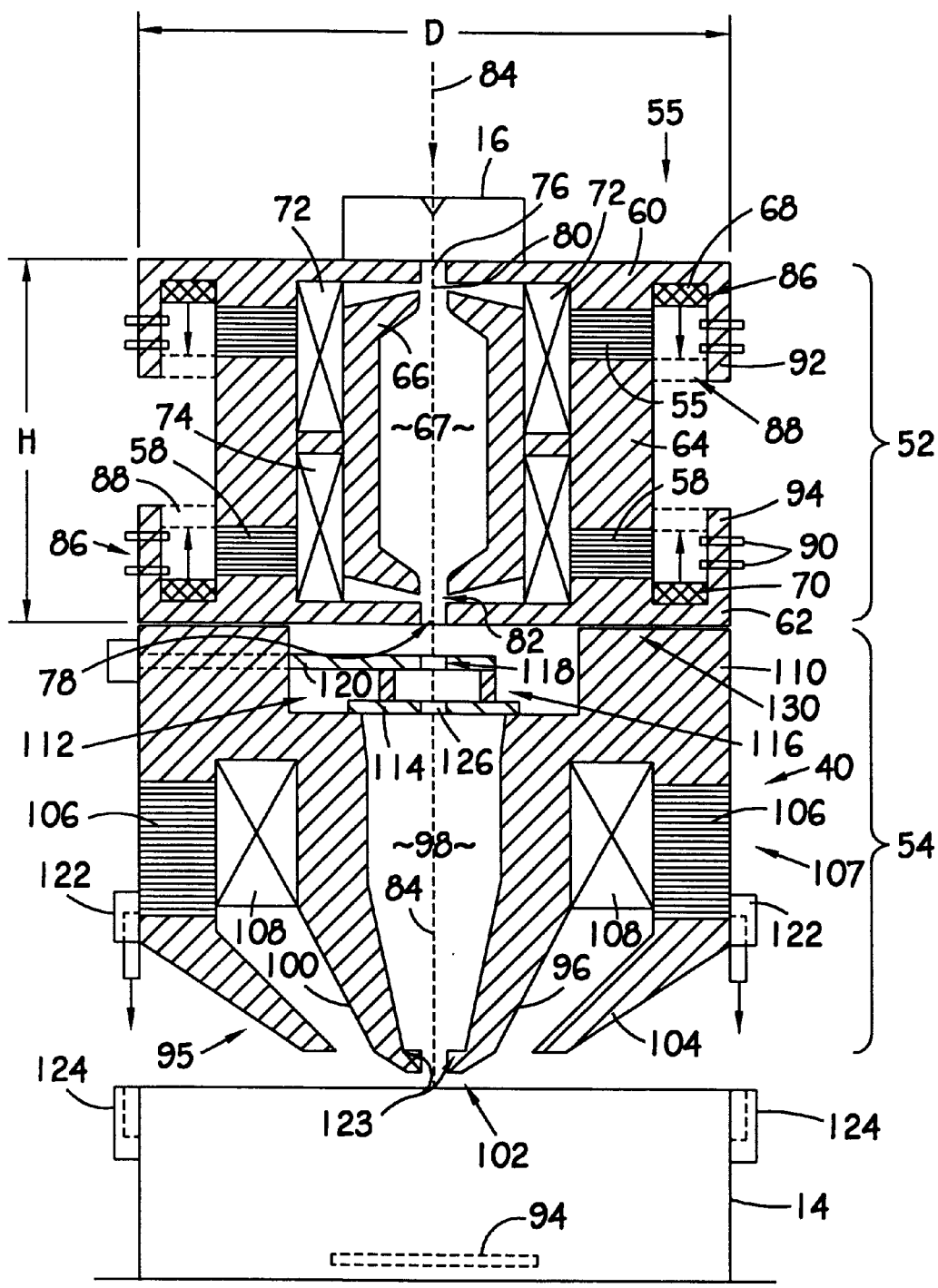
FIG. 3 is a detailed cross section of the internal structure of the SEM column.

The internal construction detail of the SEM column is shown in FIG. 3. It is a cross sectional view taken along the center line of either of the cylindrical columns 10 or 40. For clarity in illustrating, various details that will be understood by those skilled in the art are omitted, such as the flanges 18, 20, 46, 48, electrical connectors, vacuum details, etc. A variety of methods of providing these details will be apparent to those skilled in the art and need not be described in detail. The electron gun 16 and chamber 14 are also shown without details, the design of these being fairly standard, except for the detachable feature. FIG. 3 shows a condenser lens 52 housed in the top portion 42 (FIG. 2) and an objective lens 54 occupying the bottom portion 44. Of course, both lenses 52 and 54 are also included in the column 10 of FIG. 1, the only difference between column 10 and column 40 being the separability of the top and bottom portions.

The condenser lens 52 provides demagnification of the electron beam. The main field strength is provided by two cylindrical shaped permanent magnets 56, 58. All of the parts (56–74) making up the magnetic circuit are cylindrical in structure. The condenser lens has an outer magnet structure 55 including permanent magnets 56 and 58 in contact with cap pieces 60 and 62 and center cylinder 64. Caps 60 and 62 have holes 76, 78 for passage of an electron beam from gun 16. A pole piece cylinder 66 is suspended within the structure 55, and has a cylindrical bore 67 therethrough positioned in line with holes 76, 78 for passing the electron beam. The cylinder 66 is positioned relative to the caps 60, 62 to form first and second magnet gaps 80 and 82 in which a magnetic field exists for the purpose of condensing the electron beam. Two cylindrical coils 72 and 74 are positioned around the cylinder 66. Electric current is passed through the coils 72, 74 for the purpose of adjusting the level of demagnification/condensing of the primary electron beam's spot size.

Exceptional performance of the condenser lens 52 is achieved due to the novel structure described above, and the following novel combination of design features/choices. Saturation of the iron in caps 60, 62, center cylinder 64 and pole piece cylinder 66 is avoided by designing an adequate width i.e. cross section of the material, the actual dimensions of which can be designed/determined by computer simulation. The dimensions of the structure of FIG. 3 are a preferred embodiment, and can be determined directly from FIG. 3 which is drawn to scale. For example, the overall diameter D is 80 mm and the height H of the condenser lens is 53 mm. The separate pole piece cylinder 66 provides two gaps 80 and 82, forming two condenser lenses. This novel arrangement is preferred, although a more conventional single gap/lens magnet can also be used. The placement of the magnets 56, 58 in the outer portion of the magnetic circuit, away from the gaps 80, 82 is an important feature. It was found that stray fields on the optic axis 84 are reduced by positioning the permanent magnets far from the optic axis 84. The tuning coils 72, 74 are placed around the cylinder 66, and between the cylinder 66 and the magnets 56, 58. This positioning makes conservative use of space in the design as shown in FIG. 3, since the magnets 56, 58 and accompanying return path cylinder 64 are positioned far from the optic axis as is practical, consistent with the design objective of the smallest and lightest weight structure for easy replaceability/portability.

Another useful feature of the condenser lens design is the provision of an adjustable bypass of the permanent magnets 56, 58. The bypass circuit includes cylindrical extensions 92 and 94 surrounding the magnets 56 and 58. The circuit also shows slip rings 68 and 70, positioned between the magnets 56, 58 and the extensions 92 and 94. The magnetic slip rings 68, 70 can be adjusted from position 86 to position 88 (indicated by dashed outline). The positioning of the slip rings 68 and 70 provides additional adjustment to the magnetic field and corresponding demagnification of the lens. The lens coils 72 and 74 work in combination with the slip rings 68 and 70. When the slip rings are in position 88, they complete a magnetic circuit bypassing the magnets 56, 58 and thereby minimize the magnetic field in the gaps. The use of set screws 90 and various other methods of securing the rings 68, 70 in position will be apparent to those skilled in the art.

To summarize the condenser lens, the novel combination includes permanent magnets for primary field production placed in the outer magnetic return path, a pole piece cylinder with preferably two gaps, tuning coils placed between the pole piece cylinder and outer return path, and an adjustable bypass circuit for variably bypassing the permanent magnets.

The objective lens 54 includes a tapered objective lens pole piece structure 95 including a cylinder 96 having a bore 98 therethrough for passage of an electron beam. The outer diameter 100 tapers as it approaches the specimen 94. The magnetic field extending from the end 102 returns by way of a tapered, cylindrical return path 104. The pole piece cylinder 96 extends further towards the specimen 94 than does the return path 104. The resulting complete pole piece structure 95 including the end portion of cylinder 96 and portion 104, is of conical shape, having a minimum diameter closest to the specimen 94. This structure 95 allows space for the specimen to be tilted while retaining the required close proximity of the specimen to the end 102. As with the condenser lens 52, the objective lens 54 is also designed to generate the magnetic field primarily through use of a permanent magnet or magnets, which are positioned as far away from the pole piece as is practical. FIG. 3 shows the objective lens 54 with a single cylindrical magnet 106 in the outer cylindrical return path 107, and a tuning coil 108 positioned between the pole piece cylinder 96 and the outer return path 107. A top portion 110 of the lens 54 is integrally connected to the pole piece cylinder 96, and makes contact with the permanent magnet 106. The bore 98 through the cylinder 96 opens into an enlargened bore or cavity 112 in the top portion 110. The cavity 112 encloses a detector 114, such as a microchannel plate detector, upon which is mounted a pre-deflector coil 116. The cavity 112 also houses a final aperture 118 which is positioned by way of extension 120.

The lens coil 108 of the objective lens 54 is used for adjusting the focus of the beam on the specimen 94. Focusing can also be achieved by varying the specimen 94 height, i.e. position along the optics axis 84. The position of the elements 54, 52, 16 in FIG. 3 are shown elevated above the specimen chamber 14. Protrusions 122 from the objective lens 54 and protrusions 124 from the chamber 14 symbolically represent apparatus for sealably joining the column to the chamber. When the lens 54 is lowered into position on the chamber, the distance between the end 102 of the conical pole piece structure 96 and the specimen is typically about 2 mm. This close proximity places the specimen within the magnetic field of the objective lens 54. In such a condition, the lens is commonly categorized as a single pole objective immersion lens. It should be noted that a variety of different designs of the single pole objective immersion lens, condenser lens, and collection and deflection systems of the portable SEM column are possible within the general novel characteristics disclosed herein. Although the preferred embodiment of the condenser lens 52 and objective lens is shown in FIG. 3, the main requirement to accomplish the novel objective of the present invention is the design of a compact, portable SEM column using condenser and objective lenses having their primary field strength provided by permanent magnets. In addition, the lower part of the column (including the objective lens) is designed to be detachable from the specimen chamber, and the objective lens must provide high spacial resolution performance.

It should also be noted that the portable SEM column design is not dependent on the electron gun 16 type. The portable concept is compatible with a variety of different sources, such as a thermal field emission source, or a normal tungsten thermal emitter. As discussed in reference to FIGS. 1 and 2, it is possible to make the SEM column detachable from the electron gun. Details of the mechanical arrangement, vacuum pumps and system driving electronics will all be understood and within the capability of those skilled in the art, as explained above. They do not directly involve the fundamental design of the proposed portable column.

The predeflection coil(s) 116 are used to scan the primary electron beam in combination with in-lens deflection coils 123. The microchannel plate detector 114 collects secondary and back scattered electrons from the specimen 94.

Due to the improvement in permanent magnet materials over the last few decades, the design of the permanent magnets 56, 58, 106, given the basic structural concept of FIG. 3, is within the capability of those skilled in the art of magnet design, and 28 certain variations to the structural details of FIG. 3 will be apparent. These variations are included in the spirit of the present invention. The preferred material for construction of magnets 56, 58 and 106 is currently neodymium-iron-boron which has a coercive force which can be as high as $0.9 \times 10^6$ A/m, which for a magnet 2.5 cm high corresponds to a coil strength of 22500 AT. This excitation strength is much higher than that required by conventional SEMs in their normal mode of operation. The coil excitation in a standard objective magnetic lens required to focus a 25 keV beam onto a specimen 5 mm below the pole piece is typically about 1000 AT.

Permanent magnets are remarkably stable. After over 100,000 hours of use, the change in field strength is less than a small fraction of a percent.

Figure 4:
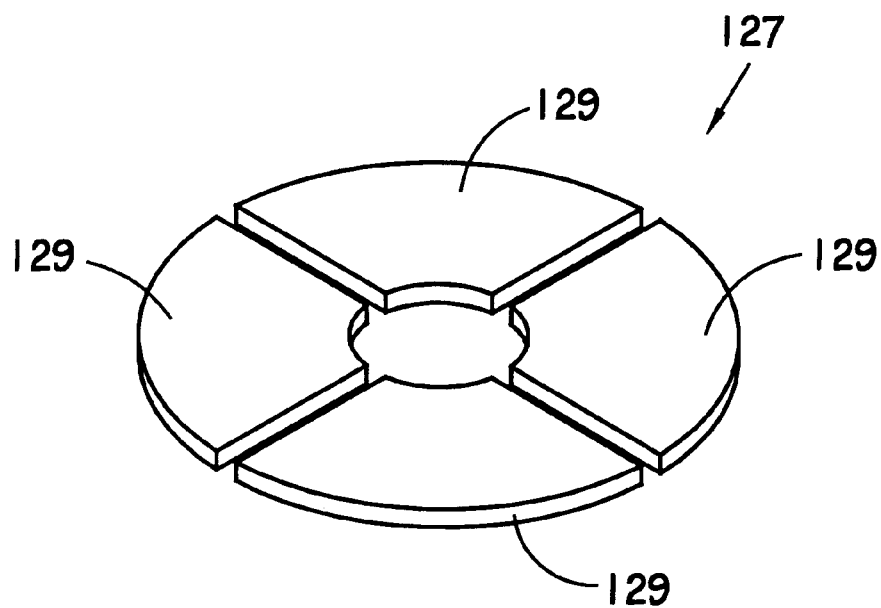
FIG. 4 illustrates an alternate method of constructing a large, thin, cylindrical permanent magnet from sections.

There are a wide variety of ways that permanent magnets can be made and it is quite common for permanent magnet manufacturers to build custom designs. For example, instead of the solid cylindrical permanent magnets 56, 58, 106 as described above, the cylindrical magnets could be constructed from segments which when placed together form the cylindrical magnets. Such a magnet 127 constructed from four segments 129 is shown in FIG. 4.

With the dimensions of the preferred embodiment of FIG. 3 (drawn to scale), NdFeB grade 35 permanent magnets produce a maximum axial field strength of 0.71 Tesla at the center of each gap 80, 82 in the condenser lens 52, which is able to produce a focal length of 1.9 mm and a demagnification of $\frac{1}{20}$ for a 25 keV beam. The total magnification of the condenser lens is thus $\frac{1}{400}$. When the slip rings 68, 70 are pushed to the positions 88 to minimize the effect of the permanent magnets 56, 58, the maximum field strength falls to 0.14 Tesla, giving a focal length of 1.9 mm and a magnification of $\frac{1}{20}$ at each gap 80, 82 for a 1 keV beam.

The maximum axial field strength for the objective lens is typically 0.26 Tesla which focuses a primary beam having energies 1 keV and 10 keV at the working distances of 0.8 mm and 3.9 mm respectively. For these conditions, the chromatic aberration coefficient is around 1.0 mm at 1 keV while the spherical aberration is approximately 2.2 mm at 10 keV. These aberration coefficients are relatively low, around 10 times lower than conventional objective lenses operating at a working distance of 5 mm. This means that the SEM column of the present invention has a high spacial resolution. The magnification of the objective lens is typically smaller than $\frac{1}{100}$ so the total magnification for the whole microscope falls below $\frac{1}{40000}$.

When a specimen 94 is bombarded with an electron beam, electrons are reflected and ejected from/by the specimen and they are referred to as backscattered and secondary electrons. For short working distances between the end 102 and the specimen 94, typically less than 2 mm, the secondary electrons will spiral up the objective lens bore 98 and be collected by the micro-channel plate detector 114. This detector is also capable of capturing backscattered electrons. It should be noted that a ring scintillator can also be used for this purpose, either close to the axis 84, or further away from it. The use of alternative detectors known to those skilled in the art are also included in the spirit of the present invention. In the case of the micro-channel plate detector 114, it has a small hole 126 at its center so that the primary beam can pass through it. As electrons travel from the specimen, the sharply decreasing magnetic field gradient over the first few millimeters collimates the secondary electrons, while the small field strength further up the lens bore 98 will cause them to spiral out radially.

Figure 5:
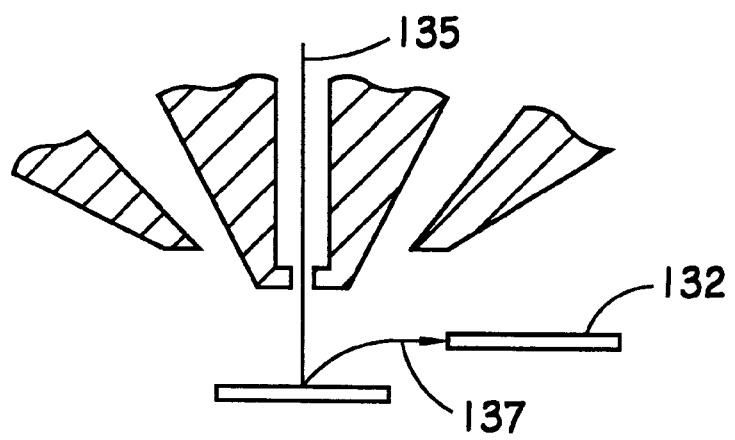
FIG. 5 shows an alternative detector location, and a prior art pole piece arrangement.

An example of an alterative type of detector is illustrated in FIG. 5, wherein a scintillator detector 132 is placed to one side of a specimen 134. A primary beam 135 is shown impinging on the specimen 134. Electrons 137 ejected/emitted from the specimen are detected by detector 132. Such variations in detectors are included in the spirit of the present invention.

Although a preferred embodiment of the present invention has been described above, it will be appreciated that certain alterations and modifications thereof will become apparent to those skilled in the art. It is therefore intended that the appended claims be interpreted as covering all such alterations and modifications as fall within the true spirit and scope of the invention.

What is claimed is:

1. A scanning electron microscope system comprising:
   (a) a specimen chamber;
   (b) an electron gun;
   (c) a portable scanning electron microscope column including a condensor lens having a permanent magnet for supplying a magnetic field for demagnification of an electron beam from said electron gun;
   (d) a gun connection system for connecting said electron gun to said column; and
   (e) a specimen connection system for rapid connect and disconnect of said column from said specimen chamber;

whereby a first column and electron gun assembly can be readily replaced with a second column and electron gun assembly.

2. A system as recited in claim 1 wherein said second column is designed for a different electron energy level than said first column.

3. A system as recited in claim 1, wherein the gun connection system permits rapidly connecting and disconnecting said column from said electron gun;

whereby a first column can be readily replaced with a second column of same or different design specifications.

4. A system as recited in claim 1 wherein said column includes an upper portion containing said condenser lens and a lower portion containing an objective lens, and said column includes a lens connecting system for disconnecting said lower portion from said upper portion;

whereby a first lower portion can be readily replaced by a second lower portion of same or different design specification.

5. A system as recited in claim 1 wherein said column further includes an objective lens having a permanent magnet means for supplying a magnetic field for focusing said electron beam.

6. A scanning electron microscope column comprising:
   (a) condenser lens having a permanent magnet for supplying a magnetic field for demagnification of an electron beam;
   (b) an objective lens; and
   (c) a specimen connection system for rapid connect and disconnect of said column from a specimen chamber.

7. A column as recited in claim 6 further comprising a gun connection system for rapid connect and disconnect from an electron gun.

8. A column as recited in claim 6, said column including an upper portion including said condenser lens and a lower portion including said objective lens, and said column including a lens connecting system for disconnecting said lower portion from said upper portion;

whereby a first lower portion can be readily replaced with a second lower portion of same or different design specification.

* * * * *